United States Patent
Warren

(10) Patent No.: US 8,013,440 B2
(45) Date of Patent: Sep. 6, 2011

(54) ENHANCED THERMAL DISSIPATION BALL GRID ARRAY PACKAGE

(75) Inventor: Robert W Warren, Newport Beach, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 230 days.

(21) Appl. No.: 12/365,101

(22) Filed: Feb. 3, 2009

(65) Prior Publication Data

US 2009/0243086 A1    Oct. 1, 2009

Related U.S. Application Data

(60) Provisional application No. 61/040,251, filed on Mar. 28, 2008.

(51) Int. Cl.
*H01L 23/34* (2006.01)
*H01L 23/52* (2006.01)

(52) U.S. Cl. .. 257/713; 257/706; 257/784; 257/E23.101

(58) Field of Classification Search ............... 257/706, 257/707, 713, E23.101
See application file for complete search history.

(56) References Cited

U.S. PATENT DOCUMENTS

| | | | |
|---|---|---|---|
| 5,616,957 A | | 4/1997 | Kajihara |
| 5,656,864 A | * | 8/1997 | Mitsue et al. ................. 257/787 |
| 5,672,548 A | * | 9/1997 | Culnane et al. ............... 438/118 |
| 5,886,408 A | * | 3/1999 | Ohki et al. ..................... 257/720 |
| 6,097,602 A | | 8/2000 | Witchger |
| 6,507,116 B1 | * | 1/2003 | Caletka et al. ................ 257/778 |
| 6,734,552 B2 | * | 5/2004 | Combs et al. ................. 257/707 |
| 6,891,259 B2 | * | 5/2005 | Im et al. ........................ 257/687 |
| 7,126,218 B1 | | 10/2006 | Darveaux |
| 7,202,561 B2 | * | 4/2007 | Seo .............................. 257/720 |
| 2002/0074649 A1 | * | 6/2002 | Chrysler et al. .............. 257/720 |
| 2005/0095875 A1 | | 5/2005 | Huang |
| 2006/0097381 A1 | * | 5/2006 | Akram ......................... 257/706 |

FOREIGN PATENT DOCUMENTS

| | | |
|---|---|---|
| EP | 0 987 757 A2 | 3/2000 |
| WO | 02/061830 A1 | 8/2002 |

OTHER PUBLICATIONS

PCT—Invitation to Pay Additional Fees and, Where Applicable, Protest Fee, Form PCT/ISA/206, dated Sep. 9, 2009, Annex to Form PCT/ISA/206 Communication Relating to the Results of the Partial International Search, 5 pages.
PCT/US2009/038592, PCT—Notification of Transmittal of the International Search Report and the Written Opinion of the International Searching Authority, or the Declaration, 19 pages.

* cited by examiner

*Primary Examiner* — Nitin Parekh

(74) *Attorney, Agent, or Firm* — Jackson Walker L.L.P.; Christopher J. Rourk

(57) ABSTRACT

In a semiconductor chip, a thermal adhesive is used to bond an internal heat spreader to an active functional die. In an alternative embodiment a dummy die is place directly on top of the active functional die and a thermal adhesive is used to bond an internal heat spreader to the dummy die. This provides a direct and relatively low thermal conductivity path from the heat source, i.e., the functional device to the top of the package, that is, the internal metal heat spreader which is also exposed to the air.

17 Claims, 3 Drawing Sheets

ENHANCED THERMAL DISSIPATION BALL GRID ARRAY PACKAGE

BACKGROUND OF THE INVENTION

1. Field of the Inventions

The invention relates generally to semiconductor packaging and specifically to improving heat dissipation within a semiconductor chip.

2. Background Information

Heat dissipation is essential in semiconductor chips. In the extreme, if a semiconductor chip is allowed to get too hot it can damage the chip. Even outside of this extreme semiconductor chips are designed to operate within a particular temperature range. In order to maintain a chip within its operating temperature range, heat must be drawn away from the chip. As chips become higher performance, they pose a greater challenge as they consume more power and generate more heat.

FIG. 1A illustrates a basic semiconductor chip package in cross-section. FIG. 1B is a close up view of semiconductor chip package 100. It should be noted that all figures in this disclosure are conceptual representations and components contained in these diagrams are not necessarily to scale. The figures are presented to illustrate the aspects and embodiments related to the present invention and should not be taken to be limiting.

Beyond semiconductor functional die 102, the semiconductor chip comprises some sort of electrical or optical interface. In FIGS. 1A and 1B this is depicted by ball grid array (BGA) 104. Functional die 102 is semiconductor substrate which has undergone a series of etching and deposition steps to fabricate circuitry upon the semiconductor substrate. The fabricated substrate is then diced into individual dies. Wire bonds 106 are used to connect various bond pads on functional die 102 to BGA 104. Finally, wire bonds 106 and functional die 102 are encased by package material 108, which can be an epoxy mold compound. Examples of the package material include epoxies or resins and are often injection molded.

In order to dissipate heat in chip 100, heat is conducted away from functional die 102 to the outside environment through package material 108. In high power applications, package material 108 can be attached to an external heat sink and in the extreme the heat since could even be coupled to an electric fan. However, to reach the heat sink, the heat is first drawn through the package material. To this end previous solutions have used more expensive mold compounds for the package material having a higher thermal conductivity (e.g. 3 W/mK instead of the standard 1 W/mk). However, in addition to the expense, these mold compounds are less reliable, and are more difficult to use in the transfer molding operation.

FIG. 2A illustrates a semiconductor chip where an internal heat spreader is used to aid in the dissipation of heat. Heat spreader 202 typically comprises a metal such as copper for conducting heat away from functional die 102. However, heat still needs to be conducted by package material 108 between functional die 102 to heat spreader 202. Heat spreader 202 can then conduct the heat off the chip and is typically exposed to the air (or external environment).

FIG. 2B illustrates the use of a dummy die to improve thermal dissipation. To reduce the distance that heat is conducted, dummy die 204 is placed on top of functional die 102 putting it in closer thermal proximity to the heat spreader 202. Dummy die 204 is typically a die segmented from an unfabricated silicon substrate.

Other chip configurations such as cavity-down or flip chip packages have also be been employed. However, these configurations are much more expensive in fact they are two to five times more expensive to manufacture. Accordingly, various needs exist in the industry to address the aforementioned deficiencies and inadequacies.

SUMMARY OF INVENTION

In a semiconductor chip, a thermal adhesive is used to bond an internal heat spreader to an active functional die. In an alternative embodiment a dummy die is place directly on top of the active functional die and a thermal adhesive is used to bond an internal heat spreader to the dummy die. This provides a direct and relatively low thermal conductivity path from the heat source, i.e., the functional device to the top of the package, that is, the internal metal heat spreader which is also exposed to the air.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Figure 1A:
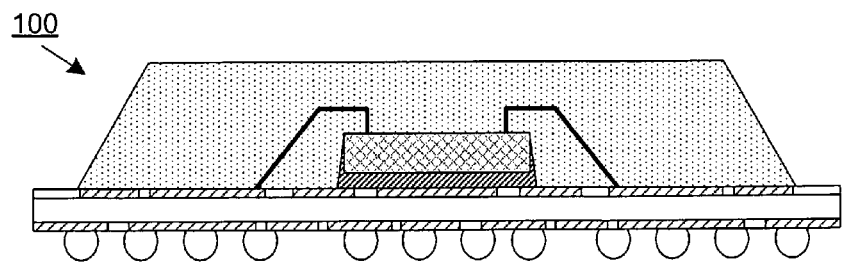
FIGS. 1A and 1B illustrates a basic semiconductor chip package in cross-section.
Figure 1B:
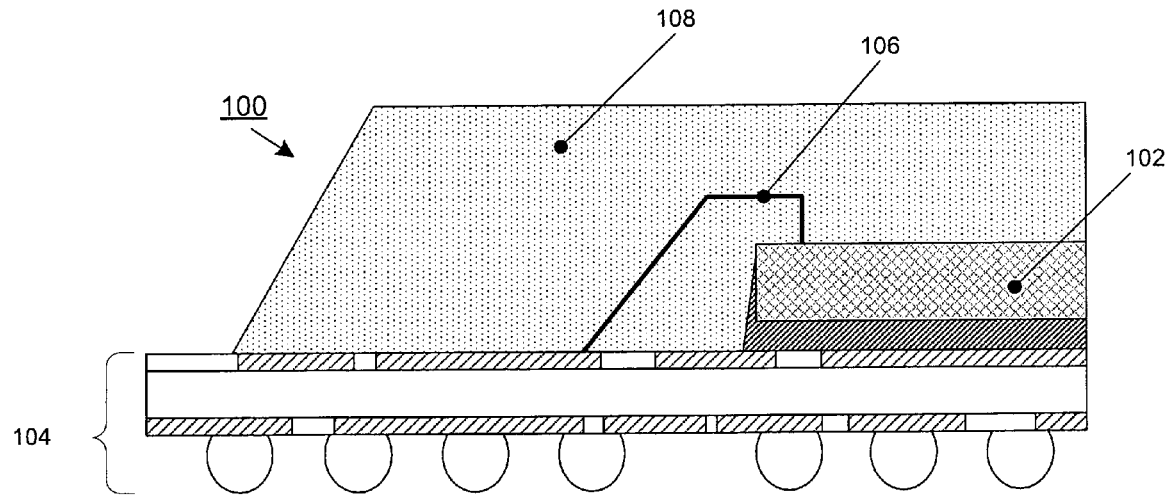
Figure 2A:
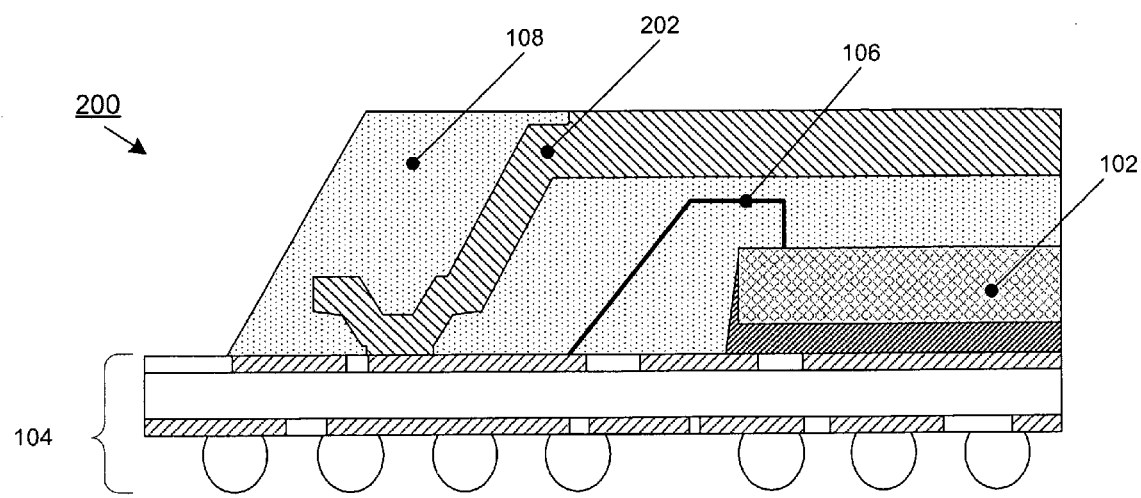
FIG. 2A illustrates a semiconductor chip package where an internal heat spreader is used to aid in the dissipation of heat.
Figure 2B:
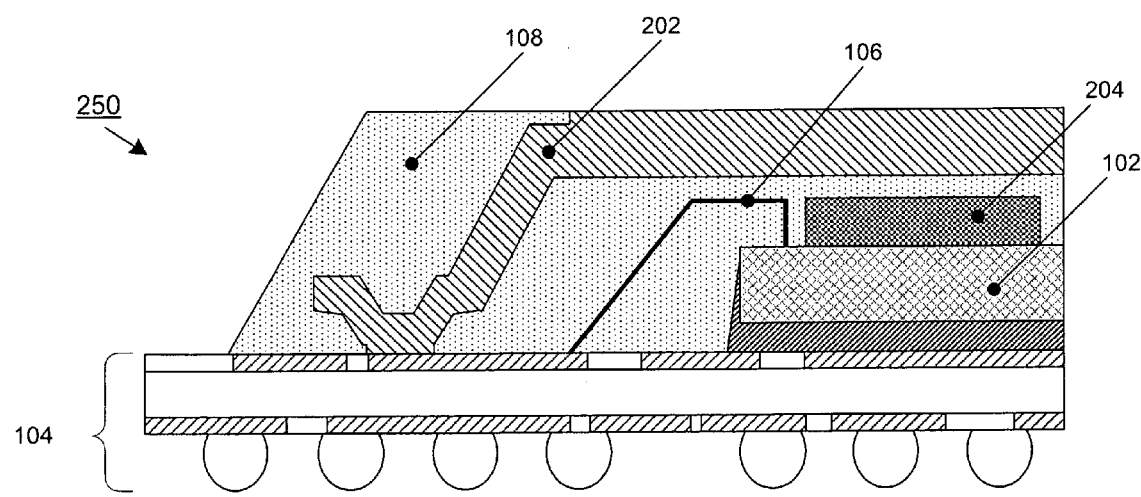
FIG. 2B illustrates the use of a dummy silicon die to improve thermal dissipation.
Figure 3:
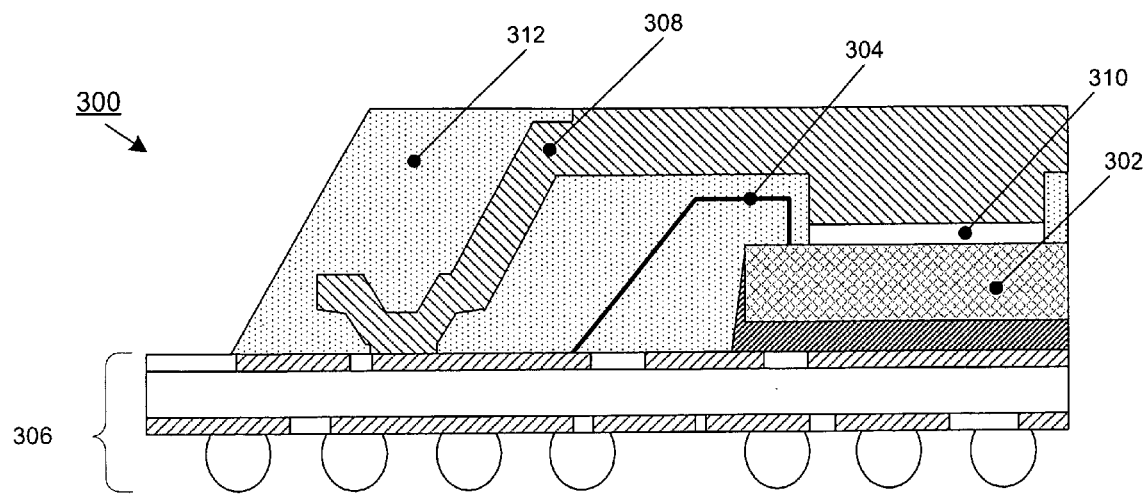
FIG. 3 illustrates the first embodiment of a semiconductor chip package with improved heat dissipation.

FIG. 3 illustrates the first embodiment. As in the prior art, semiconductor chip package 300 comprises functional die 302, wire bond 304 and interface 306. Chip package 300 further comprises internal heat spreader 308. However, thermal adhesive 310 is applied to functional die 302 and bonds to heat spreader 308. This places a direct thermal conductivity path from the functional die to the heat spreader without package material between the functional die and heat spreader. Heat spreader 308 typically comprises a metal which is often copper.

Thermal adhesive 310 can be selected from one of many types. For example, it can be a thermal interface material often used for attaching heatsinks to a package, or a thermal adhesive epoxy (film or paste) often used for stacking die within packages (e.g., stacking memory die). More specifically thermal adhesive 310 can be a particle-laden, one-component or two-component material that typically is applied with dispensing or stencil printing, or applied as a film. Adhesives are cured to allow for cross-linking of the polymer, which provides the adhesive property. The advantage of thermal adhesives is that they provide structural support, therefore eliminating the need for mechanical clamping.

Alternatively, thermal adhesive 310 can be a phase change material (PCM). PCMs undergo a transition from a solid to a semi-solid phase with the application of heat. The material is in a liquid phase at die-operating conditions. PCMs offer several advantages including the ability to conform to the mating surfaces and do not require curing.

Another alternative is that thermal adhesive 310 can be a thermal gel. Gels are low modulus, paste-like materials that are lightly cross-linked. They perform like a grease with respect to their ability to conform to surfaces.

Figure 4:
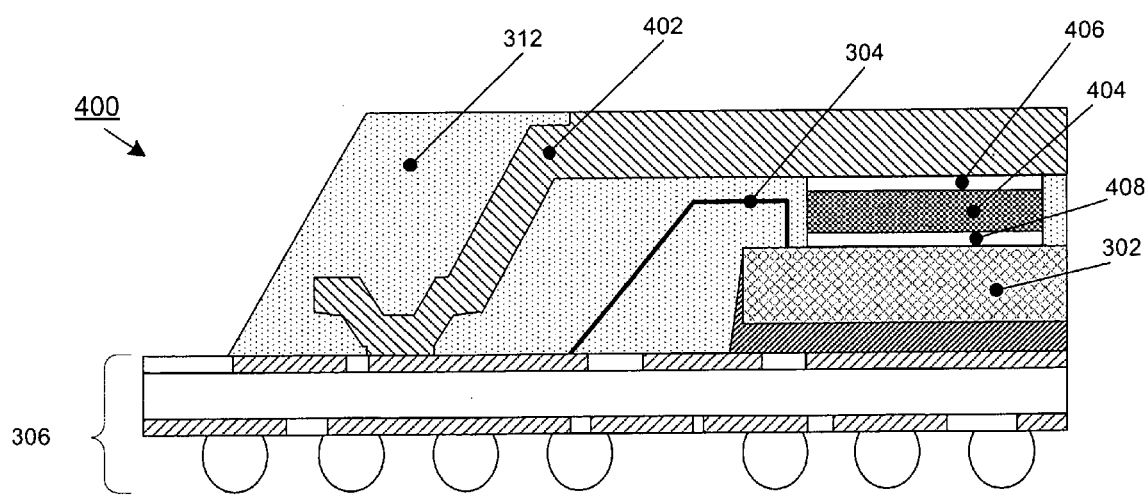
FIG. 4 illustrates the second embodiment of a semiconductor chip package with improved heat dissipation.

FIG. 4 illustrates the second embodiment. This embodiment combines the benefits of the first embodiment with the use of a dummy die. As in FIG. 3, semiconductor chip package 400 comprises functional die 302, wire bond 304, interface 306, and heat spreader 402. Dummy die 404 is placed on top of the functional die 302. Thermal adhesive 406 is applied to dummy die 404. Thermal adhesive 406 bonds to heat spreader 402 and thermally connects dummy die 404 to heat spreader 402. Like chip 250, dummy die 404 can be an unfabricated semiconductor such as silicon or to reduce cost, dummy die 404 can be a rejected die, that is a die that is shown to have too many defects to be a viable functional die. A rejected die would also reduce the waste from manufacture process. Dummy die 404 can optionally be placed on top of functional die 302 with the use of thermal adhesive 408 to improve thermal conductivity between dummy die 404 and functional die 302. Thermal adhesive 406 and thermal adhesive 408 can be selected from the wide range of options as described above for thermal adhesive 310.

Both embodiments can employ standard package materials thus eliminating the need for more expensive and less reliable than enhanced thermal dissipation material. Standard materials are also more desirable because they are more reliable in the sense that they are capable of higher moisture reflow levels. Furthermore, standard package materials are also compatible with Low-K dielectric devices in the sense that there is no cracking of dielectric during temp cycling from higher stresses. Since standard package materials are used, it is also easier and cheaper to manufacture due to the broader supply base and lower assembly cost.

The application of the aforementioned thermal adhesives poses several challenges. When applying the thermal adhesive, in order to conform well to the die and the heat spreader, pressure must be applied. If not enough pressure is applied, there will be gaps or voids between the adhesive and the die or heat spreader. If too much pressure is applied the functional die may crack. The pressure required is dependent on the type of adhesive used.

Another difficulty is to apply the thermal adhesive to cover as much of the die surface as possible without flowing over into the wire bonds. Maximum coverage ensures maximum thermal dissipation. The addition of the dummy die shown in chip package 400 removes the thermal adhesive further away from the wire bonds than in chip package 300.

Finally, there should be no voids around the thermal adhesive after transfer injection molding, the package material needs to be able to flow around the devices and totally encapsulate the wires, dies and adhesives so the final chip is reliable.

The solution disclosed can improve thermal dissipation by 10-20%, with only a slight increase in package cost (<5%) and no change in reliability performance. Furthermore, it exploits current manufacturing techniques.

It should be emphasized that the above-described embodiments are merely examples of possible implementations. Many variations and modifications may be made to the above-described embodiments without departing from the principles of the present disclosure. For example, the above-described embodiments are given for BGA packaging, but can be applicable to other types of packaging including but not limited to dual in-line package (DIP) packaging, pin grid array (PGA) packaging, leadless chip carrier (LCC) packaging, small-outline integrated circuit (SOIC) packaging, plastic leaded chip carrier (PLCC) packaging, plastic quad flat pack (PQFP) packaging and thin quad flat pack (TQFP) packaging, thin small-outline packages (TSOP) packaging, land grid array (LGA) packaging and Quad-Flat No-lead (QFN) packaging. All such modifications and variations are intended to be included herein within the scope of this disclosure.

What is claimed is:

1. A semiconductor package comprising:
   a semiconductor die having a fabricated pattern and bond pads;
   a heat spreader;
   a dummy semiconductor die in physical contact with the semiconductor die; and
   a thermal adhesive between the dummy semiconductor die and the heat spreader;
   wherein the thermal adhesive adheres the dummy semiconductor die and the heat spreader and conducts heat from the semiconductor die to the heat spreader.

2. The semiconductor package of claim 1, wherein the thermal adhesive comprises:
   a thermal interface material which comprises a thermal adhesive epoxy film, a thermal adhesive epoxy paste or combination thereof;
   a phase change material (PCM);
   a thermal gel; or
   a combination thereof.

3. The semiconductor package of claim 1, further comprising a mold compound encapsulating the semiconductor die, the heat spreader, and the thermal adhesive.

4. The semiconductor package of claim 1, wherein the semiconductor package is of a type selected from the group consisting of dual in-line package (DIP) packaging, pin grid array (PGA) packaging, leadless chip carrier (LCC) packaging, small-outline integrated circuit (SOIC) packaging, plastic leaded chip carrier (PLCC) packaging, plastic quad flat pack (PQFP) packaging and thin quad flat pack (TQFP) packaging, thin small-outline packages (TSOP) packaging, land grid array (LGA) packaging and Quad-Flat No-lead (QFN) packaging.

5. A semiconductor package comprising:
   a fabricated semiconductor die having a fabricated pattern and bond pads;
   a dummy semiconductor die placed on top of the fabricated semiconductor die and being in physical contact therewith;
   a heat spreader placed on top of the dummy semiconductor die; and
   a first thermal adhesive between the dummy semiconductor die and the heat spreader;

wherein the first thermal adhesive adheres the dummy semiconductor die and the heat spreader and conducts heat from the dummy semiconductor die to the heat spreader and wherein the dummy semiconductor die conducts heat from the fabricated semiconductor die.

6. The semiconductor package of claim 5, wherein the thermal adhesive comprises:
a thermal interface material which comprises a thermal adhesive epoxy film, a thermal adhesive epoxy paste or combination thereof;
a phase change material (PCM);
a thermal gel; or
a combination thereof.

7. The semiconductor package of claim 5 further comprising a second thermal adhesive between the dummy semiconductor die and the fabricated semiconductor die, wherein the second thermal adhesive adheres the fabricated semiconductor die and the dummy semiconductor die and conducts heat from the fabricated semiconductor die to the dummy semiconductor die.

8. The semiconductor package of claim 7, wherein the first and/or second thermal adhesive comprises a thermal interface material which comprises a thermal adhesive epoxy film, a thermal adhesive epoxy paste or combination thereof.

9. The semiconductor package of claim 8, wherein the thermal adhesive epoxy film comprises a particle-laden one-component material, a particle-laden two component material or combination thereof.

10. The semiconductor package of claim 8, where the first and/or second thermal adhesive comprises a phase change material (PCM).

11. The semiconductor package of claim 7, wherein the first and/or second thermal adhesive comprises a thermal gel.

12. The semiconductor package of claim 5, wherein the dummy semiconductor die is an unfabricated semiconductor die or a waste fabricated semiconductor die.

13. The semiconductor package of claim 5, further comprising a mold compound encapsulating the semiconductor die, the heat spreader, and the thermal adhesive.

14. The semiconductor package of claim 5, wherein the semiconductor package is of a type selected from the group consisting of DIP packaging, PGA packaging, LCC packaging, SOIC packaging, PLCC packaging, PDFQ packaging and TQFP packaging, TSOP packaging, LGA packaging and QFN packaging.

15. The semiconductor package of claim 5 wherein the dummy semiconductor die is in physical contact with the fabricated semiconductor die and no additional material is placed in between the dummy semiconductor die is in physical contact and the fabricated semiconductor die.

16. The semiconductor package of claim 1 wherein the dummy semiconductor die in placed in contact with the semiconductor die to avoid manufacturing costs associated with placing a thermal adhesive between the dummy semiconductor and the semiconductor die.

17. The semiconductor package of claim 6 wherein the dummy semiconductor die in placed on top of the fabricated semiconductor die to avoid manufacturing costs associated with placing a thermal adhesive between the dummy semiconductor and the fabricated semiconductor die.

* * * * *

UNITED STATES PATENT AND TRADEMARK OFFICE
CERTIFICATE OF CORRECTION

PATENT NO.        : 8,013,440 B2                                   Page 1 of 1
APPLICATION NO.   : 12/365101
DATED             : September 6, 2011
INVENTOR(S)       : Robert W. Warren It is certified that error appears in the above-identified patent and that said Letters Patent is hereby corrected as shown below:

Column 6, line 21, replace "in" with "is"
Column 6, line 25, replace "6" with "5"
Column 6, line 26, replace "in" with "is"

Signed and Sealed this
Eighth Day of November, 2011

David J. Kappos
*Director of the United States Patent and Trademark Office*